(12) United States Patent
Nogome et al.

(10) Patent No.: US 6,982,141 B2
(45) Date of Patent: Jan. 3, 2006

(54) SEMICONDUCTOR DEVICE AND MANUFACTURING METHOD THEREOF

(75) Inventors: Masanobu Nogome, Bizen (JP); Akiyoshi Tamura, Suita (JP); Keiichi Murayama, Okayama (JP); Kazutsune Miyanaga, Okayama (JP); Yoshitaka Kuroishi, Bizen (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 18 days.

(21) Appl. No.: 10/937,366

(22) Filed: Sep. 10, 2004

(65) Prior Publication Data

US 2005/0042549 A1    Feb. 24, 2005

Related U.S. Application Data

(62) Division of application No. 10/630,900, filed on Jul. 31, 2003.

(30) Foreign Application Priority Data

Aug. 1, 2002 (JP) ............................. 2002-224554
Jun. 18, 2003 (JP) ............................. 2003-174015

(51) Int. Cl.
    *G03F 7/00*    (2006.01)
(52) U.S. Cl. ...................... 430/311; 430/313; 430/315; 430/935
(58) Field of Classification Search ................ 430/311, 430/313, 315, 935
    See application file for complete search history.

(56) References Cited

U.S. PATENT DOCUMENTS

4,571,322 A * 2/1986 Eichelberger et al. ...... 264/154
6,440,846 B1 * 8/2002 Ikeya ......................... 438/639

FOREIGN PATENT DOCUMENTS

JP    2001-110897    4/2001

* cited by examiner

*Primary Examiner*—Nicole Barreca
(74) *Attorney, Agent, or Firm*—Wenderoth, Lind & Ponack, L.L.P.

(57) ABSTRACT

A GaAs substrate 200 is rotated, a photosensitive silicone resist 260 is applied on a surface of the GaAs substrate 200 on which an aperture of a hole 310 to be a via hole, and an inside of the hole 310 to be the via hole is filled in with the photosensitive silicone resist 260. Next, the GaAs substrate 200 is further rotated, changing the number of revolutions (rpm), and the photosensitive silicone resist 260 on the GaAs substrate is flattened. Next, a reverse side of the GaAs substrate is grinded, the hole 310 to be the via hole penetrates the GaAs substrate 200 from the surface to the reverse side and the via hole 220 is formed. Next, a reverse side electrode 240 is formed on the reverse side of the GaAs substrate 200. Next, the GaAs sustrate 200 is divided chip by chip and chips are laid on a substrate for assembly 270 via an adhesive metal 280.

20 Claims, 5 Drawing Sheets

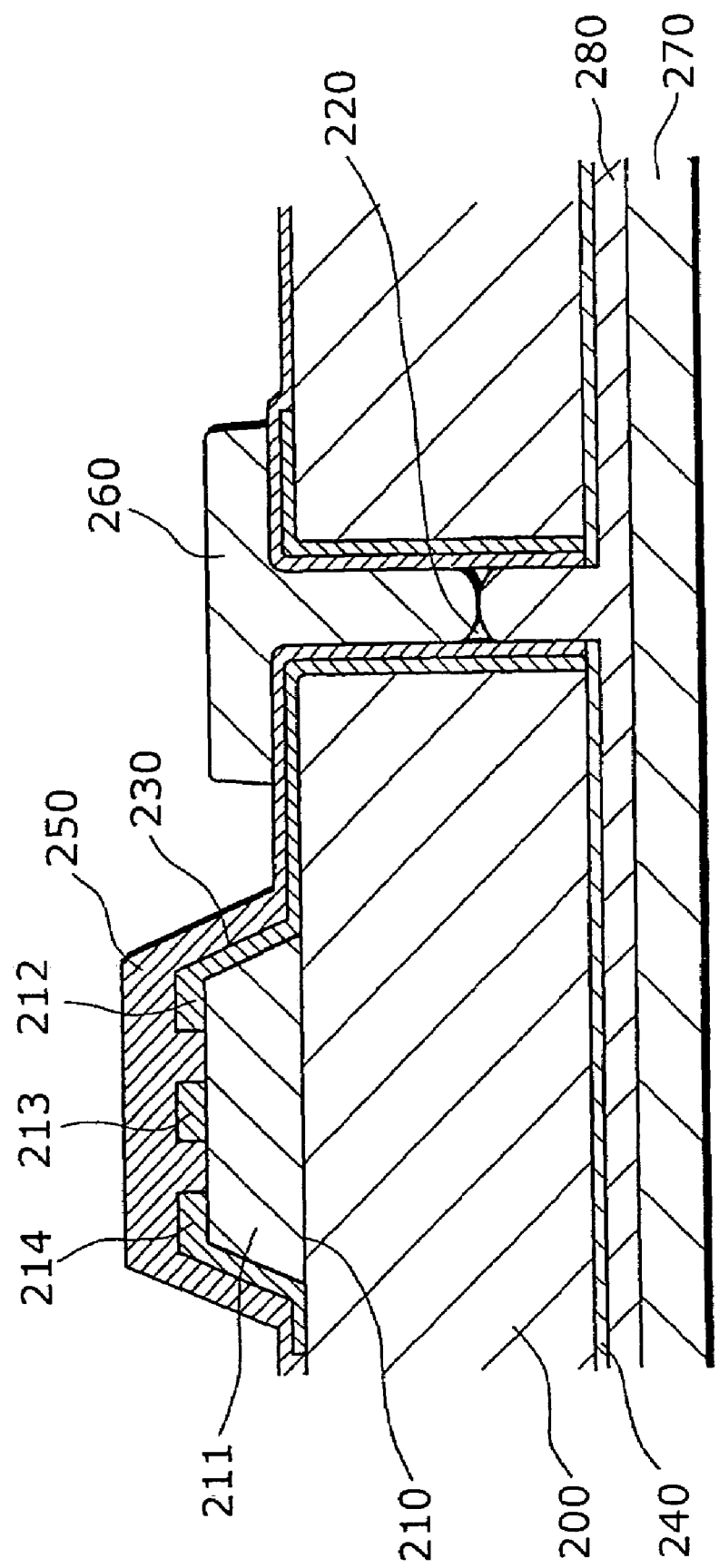

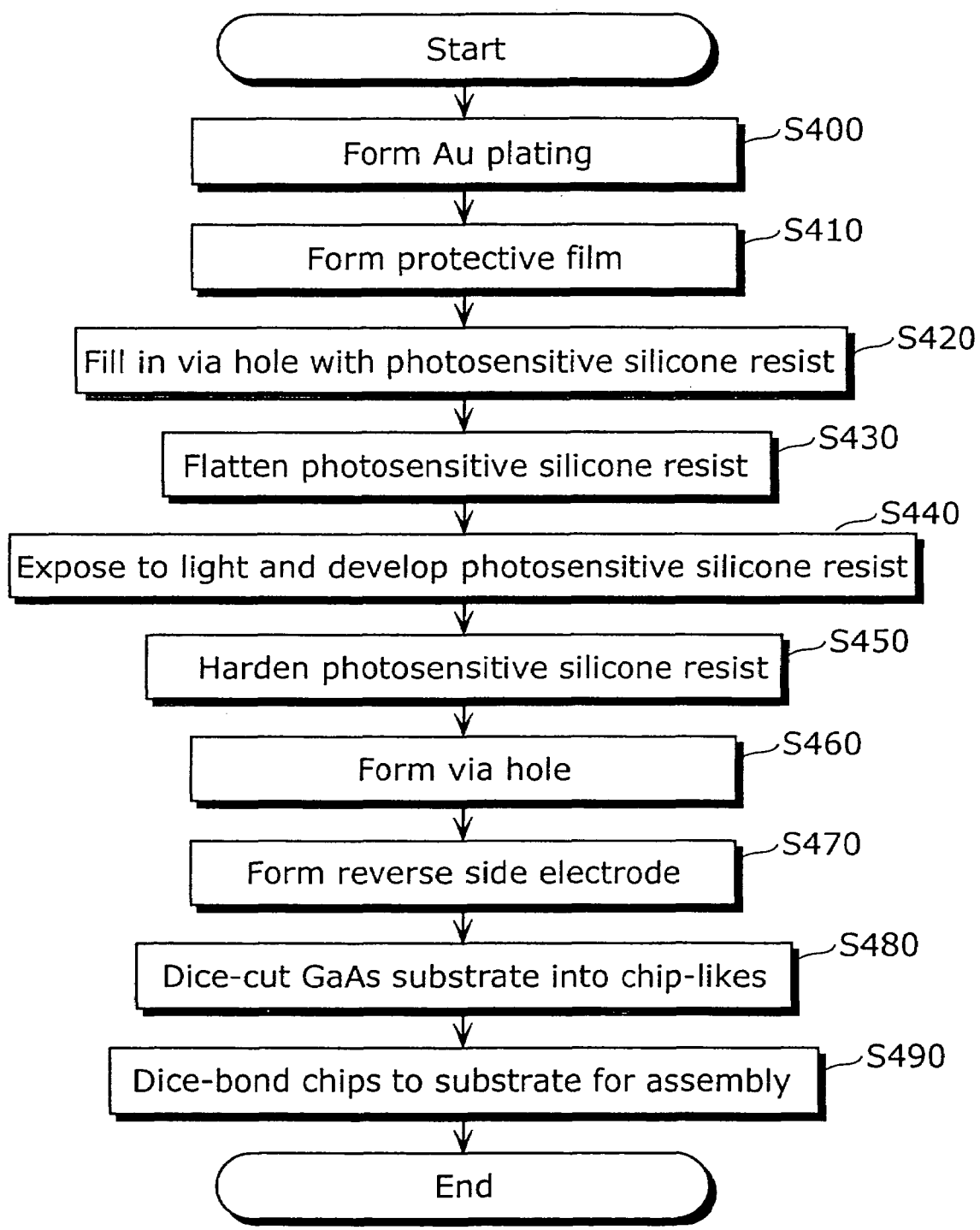

SEMICONDUCTOR DEVICE AND MANUFACTURING METHOD THEREOF

This application is a divisional application of U.S. application Ser. No. 10/630,900, filed Jul. 31, 2003, currently pending.

BACKGROUND OF THE INVENTION (1) Field of the Invention

The present invention relates to manufacturing of a semiconductor chip, and especially to a semiconductor device that prevents a defect at the time of manufacturing by filling in resin into a via hole of a semiconductor chip and its manufacturing method.

(2) Description of the Related Art

Up to now, a compound semiconductor device made of Field Effect Transistors (hereinafter, referred to as FET) or hetero bipolar transistors (hereinafter, referred to as HBT) has been long used as a high output power amplifier for transmission, a part of a cell phone and outstanding characteristics such as high output, high gain and low distortion are required. To meet this requirement, and especially to earn higher gain, together with upgrading a semiconductor element such as an FET, in a manufacturing process, a ground wiring is not pulled out from an electrode pad on a chip by a wire, but through a via hole that penetrates the chip from the reverse side. When a source electrode of an FET for amplification is grounded using this technique, it is possible to reduce significantly parasitic source inductance and increase a gain of a power amplifier.

Hereinafter, a manufacturing method of a semiconductor device having a via hole structure is explained using a cross-sectional view shown in FIG. 1.

For a start, as shown in FIG. 1A, on a surface of a GaAs substrate 100 on which a circuit made up of an FET, resistance, a capacitor and an inductor is formed, a hole 110 to be a via hole is formed with a depth of about 150 μm. Then, after Au plating 120 is formed on a part of an electrode and the hole 110 to be the via hole, a protective film 130 is formed on the top surface. At this time, it is more advantageous to form the hole 110 to be the via hole on the surface of the GaAs substrate than on the reverse side of the GaAs substrate in terms of simplicity of process.

Next, as shown in FIG. 1B, the hole 110 to be the via hole is penetrated by grinding the GaAs substrate 100 to be an about 100 μm-thin film and a via hole 140 is formed. Then, laminated metals, Cr and Au, are evaporated on the reverse side of the GaAs substrate 100 and a reverse electrode 150 is formed. Then, although it is not illustrated, the GaAs substrate 100 is dice-cut into chip-likes.

Next, as shown in FIG. 1C, a chip is dice-bonded on a substrate for assembly 160 via an adhesive metal 170, either Ag paste or AuSn paste.

By the way, in the process of dice-bonding the chip included in the manufacturing method of the semiconductor device, the adhesive metal 170 spurts out from the via hole 140 and pollutes a circuit on the surface of the chip.

As a prior art to solve the problem, "Manufacturing Method of Semiconductor device" (refer to Japanese Laid-Open Patent application No. 2001-110897) is disclosed. According to this application, in a process of a manufacturing method shown in FIG. 1A, the hole 110 to be the via hole is filled in with photocuring resin; in a process shown in FIG. 1B, a reverse side electrode is formed on all over the reverse side of the GaAs substrate 100 including a via hole aperture, which is covered with the reverse side electrode and then the photocuring resin is removed with organic solvent; spurting out of the adhesive metal 170 at the time of dice-bonding is prevented.

In the conventional manufacturing method of a semiconductor device, however, the GaAs substrate is soaked in the organic solvent and dried when the photocuring resin is removed, so there is a problem that it is difficult to handle the GaAs substrate because it becomes a thin film and breaks. Additionally, in the conventional manufacturing method of the semiconductor device, the spurting out of the adhesive metal is prevented by the reverse side electrode. But there is a problem that when the reverse side electrode is thin, it is not sufficient to cover the via hole aperture; holes open up in the reverse side electrode; and the adhesive metal spurts out; on the other hand, the reverse side electrode is thick, it is difficult to dice-cut. Furthermore, in the conventional manufacturing method of the semiconductor device, the photocuring resin fills in only the via hole; the via hole aperture on the surface of the GaAs substrate is not fully covered with the photocuring resin; and there is a problem that when the adhesion between the plating on the sidewall of the via hole and the photocuring resin is weak, the spurting out of the reverse side metal to the surface of the chip occurs at the time of the vapor deposition of the reverse side electrode.

SUMMARY OF THE INVENTION

In view of the foregoing, it is the object of the present invention to provide a semiconductor device that has no spurting out of an adhesive metal and prevents a defect at the time of manufacturing and its manufacturing method.

To achieve the object, the semiconductor according to the present invention is a semiconductor device that includes a semiconductor substrate having a via hole that penetrates the semiconductor substrate from a surface to a reverse side, wherein a part of an electrode formed on the surface of the semiconductor substrate reaches the reverse side of the semiconductor substrate through the via hole, and an inside of the via hole is filled in with a photosensitive resin to fully cover an aperture of the via hole on the surface of the semiconductor substrate. Here, it is acceptable that a main ingredient of the photosensitive resin is silicone resin or epoxy resin and that viscosity of the photosensitive resin at 25° C. is 70~600 m Pa.s.

Hereby, since the via hole of the semiconductor substrate is filled in with the photosensitive resin and the photosensitive resin is not removed, an effect to realize the semiconductor device that has no spurting out of an adhesive metal and prevents a defect at the time of manufacturing is achieved.

Additionally, it is tolerable that the photosensitive resin is filled in more shallowly than depth of the via hole.

Hereby, when the semiconductor substrate is grinded to form the via hole, the photosensitive resin has no influence, and therefore, an effect to realize a low-cost semiconductor device that significantly reduces damage such as yield is achieved.

Moreover, the present invention may be a manufacturing method of a semiconductor including a semiconductor substrate having a via hole that penetrates the semiconductor substrate from a surface to a reverse side and a substrate for assembly connected to the reverse side of the semiconductor substrate via an adhesive metal, the manufacturing method comprising: a photosensitive resin filling process of rotating the semiconductor substrate, applying a photosensitive resin to a surface of the semiconductor substrate on which a hole to be a via hole is formed, and filling in an inside of the hole to be the via hole with the photosensitive resin to fully cover an aperture of the hole to be the via hole; a photosensitive resin flattening process of rotating the semiconductor substrate and flattening the photosensitive resin on the surface of the semiconductor substrate; a via hole forming process of grinding the reverse side of the semiconductor substrate until the hole to be the via hole appears and forming the via hole; a reverse side electrode forming process of forming a reverse side electrode on the semiconductor substrate; and a laying process of dividing the semiconductor substrate chip by chip and laying the divided semiconductor substrate on the substrate for assembly via an adhesive metal.

Here, it is satisfactory that a photosensitive resin whose main ingredient is silicone resin or epoxy resin is applied in the photosensitive resin filling process, that a photosensitive resin whose viscosity at 25° C. is 70~600 m Pa.s is applied in the photosensitive resin filling process and that the adhesive metal is either Ag paste or AuSn paste, and chips are laid on the substrate for assembly via either Ag paste or AuSn paste in the laying process.

Furthermore, it is acceptable that the semiconductor substrate is rotated at 200~900 rpm in the photosensitive resin filling process, and the semiconductor substrate is rotated in order that a film thickness of the surface of the photosensitive resin becomes 4~10 μm in the photosensitive resin flattening process and that a photosensitive resin whose viscosity at 25° C. is 70~600 m Pa.s is applied in the photosensitive resin filling process.

Hereby, since the adhesive metal does not spurt out when the chips are laid on the substrate for assembly and it is not necessary to add a process to remove the photosensitive resin, an effect to realize a manufacturing method of the semiconductor that has no spurting out of an adhesive metal and prevents a defect at the time of manufacturing is achieved.

As further information about technical background to this application, Japanese patent application No. 2002-224554 filed on Aug. 1, 2002 is incorporated herein by reference.

BRIEF DESCRIPTION OF THE DRAWINGS

These and other subjects, advantages and features of the invention will become apparent from the following description thereof taken in conjunction with the accompanying drawings that illustrate a specific embodiment of the invention. In the Drawings:

FIG. 2 is a cross-sectional view of a semiconductor device according to the embodiment of the present invention.

FIG. 4 is a flowchart showing the manufacturing method of the semiconductor device according to the present embodiment.

DESCRIPTION OF THE PREFERRED EMBODIMENT(S)

Figure 1A:
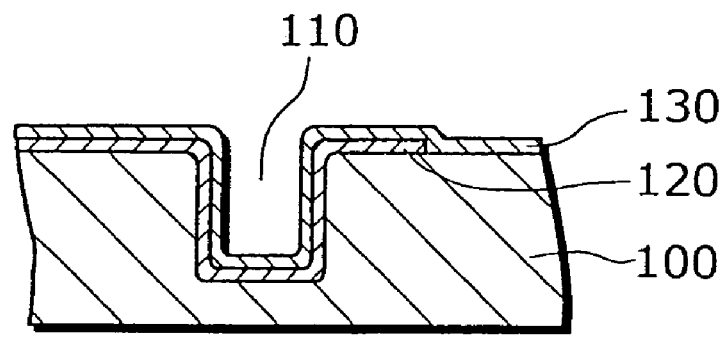
FIG. 1A~1C are cross-sectional views of a semiconductor device that has a conventional via hole structure showing a manufacturing method of the semiconductor device.
Figure 1B:
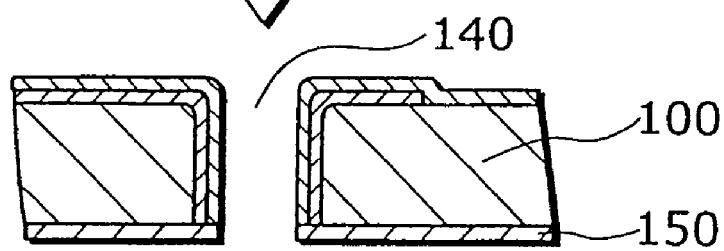
Figure 1C:
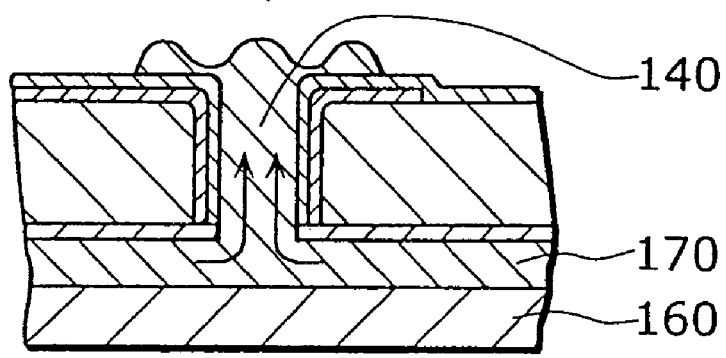

The semiconductor device according to the present embodiment of the present invention will be explained below with reference to the figures.

FIG. 2 is a cross-sectional view in outline of a semiconductor device according to the embodiment of the present invention.

The semiconductor device according to the present embodiment aims to realize a semiconductor device that has no spurting out of an adhesive metal and prevents a defect at the time of manufacturing. The semiconductor device is made up of a GaAs substrate 200 that is a semiconductor substrate; a semiconductor element 210; a via hole 220 that is 70 μm φ in diameter and penetrates the GaAs substrate 200 from the surface to the reverse side; Au plating 230 that grounds a source electrode 212 to the reverse side of the GaAs substrate 200 through the via hole 220; a reverse side electrode 240 made of laminated metals of Cr and Au; a protective film 250; a negative-type photosensitive silicone resist 260 that is formed in 4~10 μm-film thickness in the vicinity of the via hole 220 on the surface of the GaAs substrate 200, fills in the via hole 220 with about 30 μm-depth and prevents the spurting out of the adhesive metal at the time dice-bonding; a substrate for assembly 270 that is a lead frame; and an adhesive metal 280 that is either Ag paste or AuSn paste and bonds the substrate for assembly 270 and the GaAs substrate 200. By the way, the GaAs substrate 200 may be another semiconductor substrate such as an InP substrate, a GaN substrate, a compound semiconductor substrate or a Si substrate. Additionally, the Au plating 230 is described to ground a source electrode 212 to the reverse side of the GaAs substrate 200 but the Au plating 230 may ground another electrode formed on the surface of the GaAs substrate 200 to the reverse side of the GaAs substrate 200 or a plurality of electrodes to the reverse side of the GaAs substrate 200.

Here, the semiconductor element 210 is a three-terminal element such as a bipolar transistor, an FET or an HBT, and is made up of an element region 211, a source electrode 212, a gate electrode 213 and a drain electrode 214. In addition, the semiconductor element 210 is described to be the three-terminal element but it may be a two-terminal element such as a laser diode, a rectification diode or a multi-terminal element; it may be an integrated circuit made up of a plurality of semiconductor elements, an analogue integrated circuit including an inductor and a capacitor or a microwave integrated circuit including an inductor and a capacitor.

Moreover, the photosensitive silicone resist 260 is the silicone resin whose main ingredient is siloxane resin manufactured by Shin-Etsu Chemical Co., Ltd. (product name: SINR-3170-7.0 or SINR-3170L-7.0). By the way, the photosensitive silicone resist 260 may be the ultraviolet curing resin whose main ingredient is epoxy resin. Furthermore, the photosensitive silicone resist 260 may be a positive type.

Next, a manufacturing method of a semiconductor device having the structure described above is explained according to a cross-sectional view shown in FIG. 3 and a flowchart shown in FIG. 4.

It should be noted that the same component parts as in FIG. 2 are given the same numbers and a detailed explanation of them is omitted here.

Figure 3A:
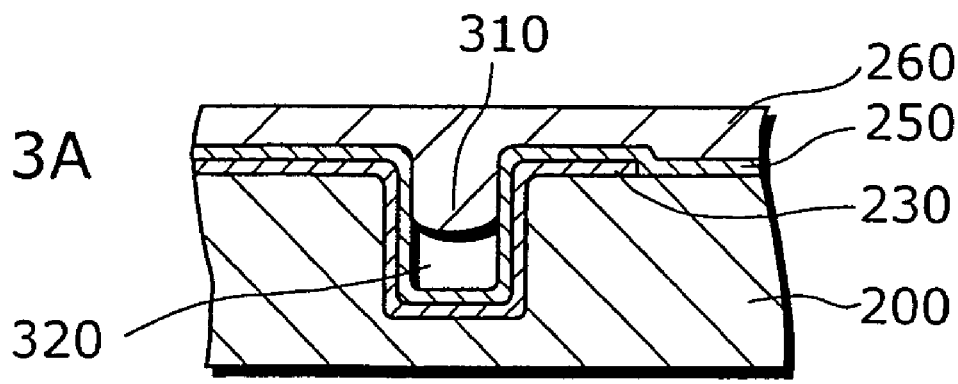
FIG. 3A~3D are cross-sectional views of the semiconductor device showing a manufacturing method of the semiconductor device.

For a start, as shown in FIG. 3A, after a hole 310 to be a via hole is formed with a depth of 150 μm on the surface of the GaAs substrate 200 on which the semiconductor elements (not illustrated) are formed, the Au plating 230 is formed on a part of an electrode and the hole 310 to be the via hole that are formed on the surface of the GaAs substrate 200 (Step S400). Then, the protective film 250 that covers the semiconductor elements and the Au plating 230 is formed (Step S410). Then, after the GaAs substrate 200 is rotated using a spin coat with a low speed of about 750 rpm and the photosensitive silicone resist 260 is applied to the surface of the GaAs substrate 200 on which the hole 310 to be the via hole is formed, the GaAs substrate 200 is rotated for about one minute and the hole 310 to be the via hole is filled in with the photosensitive silicone resist 260 at the depth of about 30 μm (Step S420). Then, further the GaAs substrate 200 is rotated at the speed of about 3000 rpm for 20 seconds to flatten the photosensitive silicone resist 260 on the GaAs substrate 200 in about 7 μm-film thickness (Step S430). At this time, since the hole 310 to be the via hole is filled in with the photosensitive silicone resist 260 in about 30 μm-depth, a cavity 320 with the depth of about 120 μm from the bottom of the photosensitive silicone resist 260 is created. By the way, at the time of flattening the photosensitive silicone resist 260, the GaAs substrate 200 is rotated at the speed of 3000 rpm for 20 seconds, but it is acceptable to rotate the GaAs substrate with another number of revolutions (rpm) and for other length of time as long as the photosensitive silicone resist 260 with good in-plane evenness in 4~10 μm-film thickness is formed on the surface of the GaAs substrate 200. Additionally, when the hole 310 to be the via hole is filled in with the photosensitive silicone resist 260, the GaAs substrate is rotated at about 750 rpm, but it is acceptable to rotate the GaAs substrate at 200 rpm or more and 900 rpm or less, further preferably at 500 rpm or more and 800 rpm or less as long as the hole 310 to be the via hole is filled in with the photosensitive silicone resist 260 at the depth of 20 μm or more.

Figure 3B:
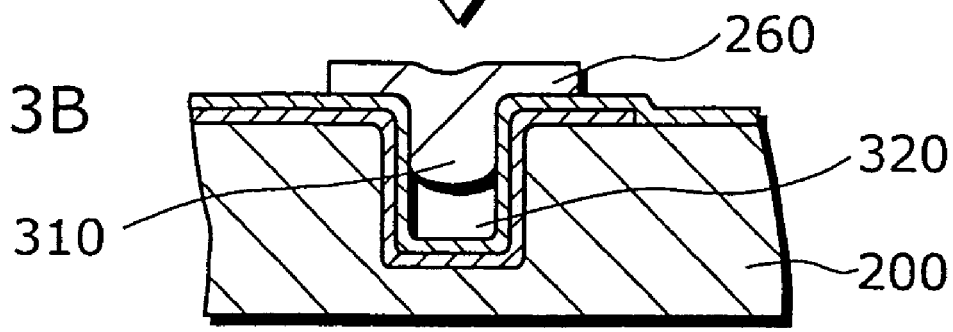

Next, as shown in FIG. 3B, the photosensitive silicone resist 260 is exposed to light, developed and left so that it covers fully the aperture of the hole 310 to be the via hole (Step S440). At this time, since the film thickness of the photosensitive-silicone resist 260 is 4~10 μm on the surface of the GaAs substrate 200, it does not occur that the development is difficult because the film thickness is too thick. In addition, the development is done by dipping the photosensitive silicone resist 260 in developer, IPA (isopropyl alcohol) or ethyl lactate after baking the photosensitive silicone resist 260 at 90° C. for 120 seconds. Then, the photosensitive silicone resist 260 is baked at about 200° C. for 60 minutes and hardened (Step S450). By the way, since the baking temperature is low, there is no influence of the temperature to the characters of the semiconductor element.

Here, when the viscosity of the photosensitive silicone resist 260 is too high, two problems occur: (1) when the photosensitive silicone resist 260 is developed, it leaves on the electrode part and the like on the GaAs substrate 200 after the development and the semiconductor device becomes defective and (2) when the photosensitive silicone resist 260 fills in the hole 310 to be the via hole, the filling in cannot be fully performed, and therefore, it is impossible to fully close the hole 310 to be the via hole with the photosensitive silicone resist 260. On the other hand, when the viscosity of the photosensitive silicone resist 260 is too low, two problems also occur: (1) when the photosensitive silicone resist 260 is flattened, the film thickness of the photosensitive silicone resist 260 on the surface of the GaAs substrate becomes thin or even disappears, and therefore, it is impossible to fully cover the aperture of the hole 310 to be the via hole with the photosensitive silicone resist 260 and (2) when the photosensitive silicone resist 260 fills in the hole 310 to be the via hole, the former infills the latter, and therefore, the cavity 320 is not created. Consequently, the viscosity of the photosensitive silicone resist 260 at 25° C. is determined to be 450 m Pa·s. By the way, it is acceptable that the viscosity of the photosensitive silicone resist 260 at 25° C. is 70~600 m Pa.s.

Figure 3C:
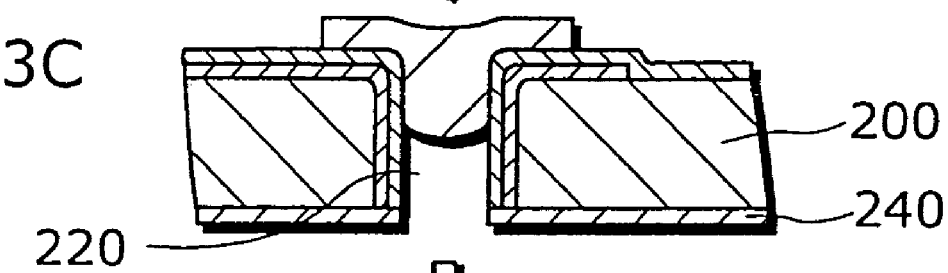

Next, as shown in FIG. 3C, the hole 310 to be the via hole is penetrated by grinding the GaAs substrate into a thin film in about 100 μm-film thickness and the via hole 220 is formed (Step S460). Then the reverse side electrode 240 is formed by evaporating the laminated metals, Cr and Au, on the reverse side of the GaAs substrate 200 (Step S470). Then, it is not illustrated but the GaAs substrate 200 is dice-cut into chip-likes (Step S480).

Figure 3D:
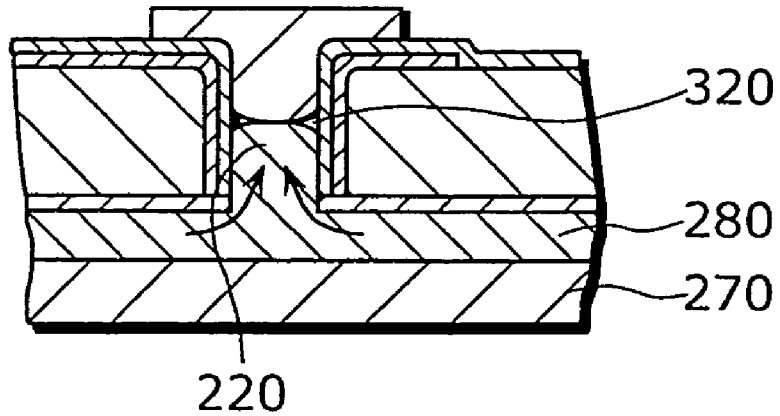

Next, as shown in FIG. 3D, the chips are dice-bonded to the substrate for assembly 270 on which the adhesive metal 280 is applied in advance (Step S490). At this time, the adhesive metal 280 is pressed by the chips and enters into the via hole 220 but the adhesive metal 280 stops after entering a part of the cavity 320 and does not spurt out to the surface of the chip because there is an about 70 μm-difference between the under side of the photosensitive silicone resist 260 and the reverse side of the GaAs substrate 200.

Figure 5:
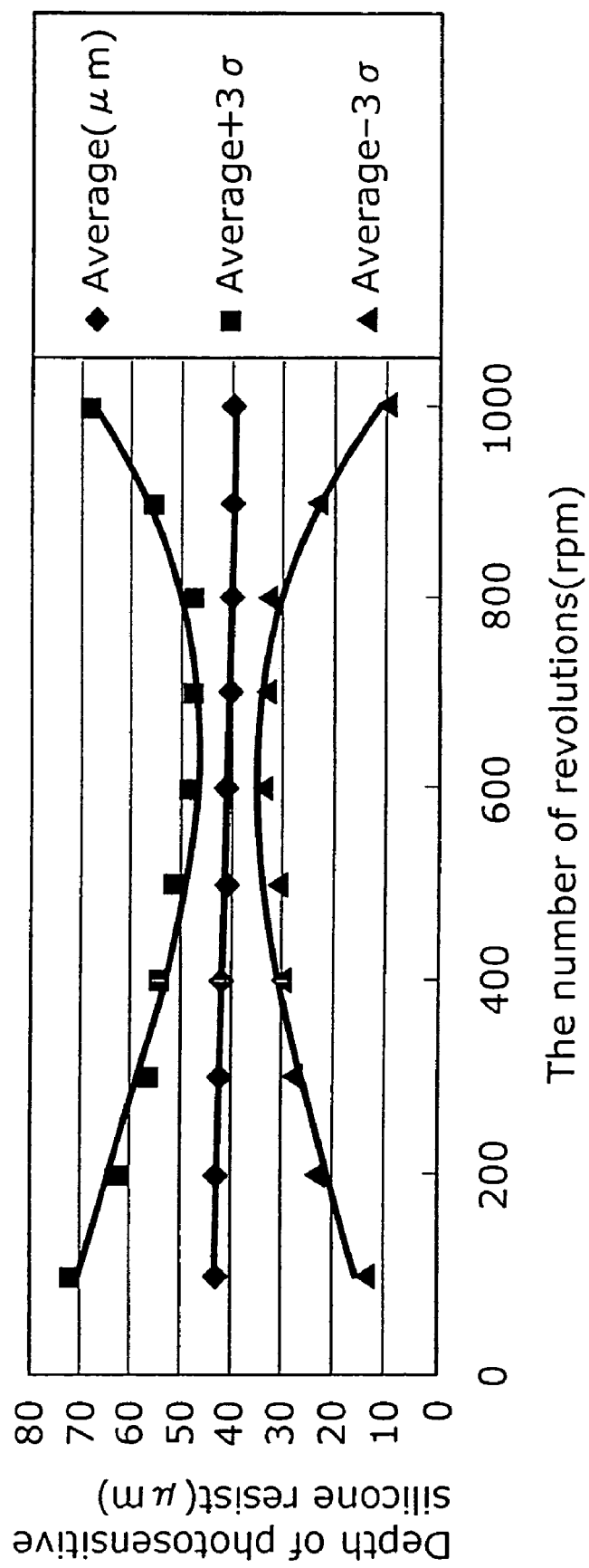
FIG. 5 is a graph showing the relationship between the depth of the photosensitive silicone resist 260 that fills in the hole 310 to be the via hole and the number of revolutions (rpm) when the number of revolutions (rpm) is changed at S420 in the flowchart of FIG. 4.

FIG. 5 is a graph showing the relationship between the depth of the photosensitive silicone resist 260 that fills in the hole 310 to be the via hole and the number of revolutions (rpm) when the number of revolutions (rpm) is changed at S420 in the flow chart of FIG. 4 showing the manufacturing method of the semiconductor device.

It can be understood from FIG. 5 that when the number of revolutions (rpm) is 200 rpm or more and 900 rpm or less, the photosensitive silicone resist 260 with the depth of 20 μm or less is outside of the ±3 σ-range and further when the number of the revolutions (rpm) is 500 rpm or more and 800 rpm or less, the photosensitive silicone resist 260 with the depth outside of 40 μm±25% (10 μm)-range is outside of the ±3 σ-range. The present invention uses the result like this. To prevent the spurting out of the adhesive metal 280, it is necessary that the photosensitive silicone resist 260 is 20 μm in depth inside of the via hole 220 and it is preferable that the photosensitive silicone resist 260 is 40 μm±25% in depth, and therefore, the number of the revolutions (rpm) is described to be 200 rpm or more and 900 rpm or less and preferably be 500 rpm or more and 800 rpm or less.

As is described above, according to the present embodiment, the semiconductor device has the photosensitive silicone resist within the via hole. Consequently, it is possible to prevent the spurting out of the adhesive metal that occurs when the chips are dice-bonded on the substrate for the assembly, and therefore, the semiconductor device according to the present embodiment can realize a semiconductor that has no spurting out of an adhesive metal and its manufacturing method.

Additionally, according to the present embodiment, the photosensitive silicone resist in the via hole is not removed. As a result, since the process to remove the photosensitive silicone resist is not necessary, the semiconductor device according to the present embodiment can realize a semiconductor device that prevents a defect at the time of manufacturing and its manufacturing method.

Moreover, according to the present embodiment, the photosensitive silicone resist fills in the via hole so that a cavity is formed in the hole to be the via hole. Consequently, the photosensitive silicone resist does not have a bad influence that occurs at the time of grinding the GaAs substrate such as grinding unevenness resulted from difference in hardness of the photosensitive silicone resist and the GaAs substrate, and therefore, the semiconductor device according to the present embodiment significantly reduces damage of yield and the like and can realize a low-cost semiconductor device and its manufacturing method.

Furthermore, according to the present embodiment, the aperture of the via hole on the surface of the GaAs substrate is fully covered by the photosensitive silicone resist. As a result, since the spurting out of the adhesive metal at the time of dice-bonding is completely preventable, the semiconductor device according to the present embodiment can realize a semiconductor that has completely no spurting out of an adhesive metal and its manufacturing method.

By the way, in the present embodiment, the lead frame is exemplified as the substrate for assembly and it is described that the chips are dice-bonded on the lead frame. But the substrate for assembly is an implementation substrate and it is acceptable that chips are implemented on the implementation substrate.

Additionally, in the present embodiment, it is described that the photosensitive silicone resist fills in the via hole so that a cavity is formed in the hole to be the via hole. But it is acceptable that the cavity is not formed as long as influence that the photosensitive silicone resist has when the photosensitive silicone resist grinds the semiconductor substrate is within a permissible range and it is tolerable that the photosensitive silicone resist infills the hole to be the via hole.

As is apparent from the above explanation, by the semiconductor device according to the present invention, the photosensitive silicone resist fills in the via hole of the semiconductor substrate and the photosensitive silicone resist is not removed, and therefore, the semiconductor device according to the present invention has the effect of realizing the semiconductor device that has no spurting out of an adhesive metal and prevents a defect at the time of manufacturing and its manufacturing method.

Consequently, by the present invention, it is possible to provide the semiconductor device that has no spurting out of an adhesive metal and prevents a defect at the time of manufacturing and its manufacturing method, and therefore, its practical value is extremely high.

What is claimed is:

1. A method of manufacturing a semiconductor, comprising:
    forming a hole in a semiconductor substrate in a front surface of the semiconductor substrate so that the hole extends toward a rear surface of the semiconductor substrate;
    forming a metal plating over the front surface of the semiconductor substrate and over an inner surface of the hole;
    applying a photosensitive resin to a front side of the semiconductor substrate at the hole while rotating the semiconductor substrate so as to fill at least a portion of the hole and fully cover an opening of the hole with the photosensitive resin;
    flattening the photosensitive resin by rotating the semiconductor substrate so as to flatten the photosensitive resin over at least a portion of the front surface of the semiconductor substrate around the hole;
    grinding the rear surface of the semiconductor substrate until a rear end of the hole is exposed so as to form a via hole through the semiconductor substrate;
    forming a rear side electrode over the rear surface of the semiconductor substrate;
    dividing the semiconductor substrate into chips; and
    connecting a rear side of the divided semiconductor substrate to an assembly substrate with an adhesive metal.

2. The method of claim 1, wherein said applying of the photosensitive resin to the front side of the semiconductor substrate comprises filling the hole with the photosensitive resin to a depth less than an entire depth of the hole so as to create a cavity between a bottom of the hole and the photosensitive resin.

3. The method of claim 1, wherein said forming of the rear side electrode comprises forming the rear side electrode only over the rear surface of the semiconductor substrate without covering the exposed rear end of the hole.

4. The method of claim 1, wherein said applying the photosensitive resin to the semiconductor substrate comprises rotating the semiconductor substrate at a speed in a range of 200 rpm to 900 rpm, and said flattening the photosensitive resin comprises rotating the semiconductor substrate so that the photosensitive resin achieves a film thickness in a range of 4 $\mu$m to 10 $\mu$m.

5. The method of claim 4, wherein said applying the photosensitive resin to the semiconductor substrate comprises applying a photosensitive resin having a main ingredient of silicone resin or epoxy resin.

6. The method of claim 5, wherein said applying the photosensitive resin to the semiconductor substrate comprises applying a photosensitive resin having viscosity at 25° C. in a range of 70 mPa·s to 600 mPa·s.

7. The method of claim 6, wherein said forming the rear side electrode comprises forming a rear side electrode made of laminated Cr and Au metals.

8. The method of claim 4, wherein said connecting the rear side of the divided semiconductor substrate to the assembly substrate comprises connecting the rear side with Ag paste or AuSn paste.

9. The method of claim 1, wherein said applying the photosensitive resin to the semiconductor substrate comprises applying a photosensitive resin having a main ingredient of silicone resin or epoxy resin.

10. The method of claim 1, wherein said applying the photosensitive resin to the semiconductor substrate comprises applying a photosensitive resin having viscosity at 25° C. in a range of 70 mPa·s to 600 mPa·s.

11. The method of claim 1, wherein said forming the rear side electrode comprises forming a rear side electrode made of laminated Cr and Au metals.

12. A method of manufacturing a semiconductor, comprising:
    forming a hole in a semiconductor substrate in a front surface of the semiconductor substrate so that the hole extends toward a rear surface of the semiconductor substrate;
    forming a metal plating over the front surface of the semiconductor substrate and over an inner surface of the hole;
    applying a photosensitive resin to a front side of the semiconductor substrate at the hole while rotating the semiconductor substrate so as to fully cover an opening of the hole with the photosensitive resin and fill the hole with the photosensitive resin to a depth less than an entire depth of the hole so as to create a cavity between a bottom of the hole and the photosensitive resin;
    grinding the rear surface of the semiconductor substrate until a rear end of the hole is exposed so as to form a via hole through the semiconductor substrate;

forming a rear side electrode over the rear surface of the semiconductor substrate;

dividing the semiconductor substrate into chips; and connecting a rear side of the divided semiconductor substrate to an assembly substrate with an adhesive metal.

13. The method of claim 12, wherein said applying the photosensitive resin to the semiconductor substrate comprises rotating the semiconductor substrate at a speed in a range of 200 rpm to 900 rpm, and said flattening the photosensitive resin comprises rotating the semiconductor substrate so that the photosensitive resin achieves a film thickness in a range of 4 $\mu$m to 10 $\mu$m.

14. The method of claim 13, wherein said applying the photosensitive resin to the semiconductor substrate comprises applying a photosensitive resin having a main ingredient of silicone resin or epoxy resin.

15. The method of claim 14, wherein said applying the photosensitive resin to the semiconductor substrate comprises applying a photosensitive resin having viscosity at 25° C. in a range of 70 mPa·s to 600 mPa·s.

16. The method of claim 15, wherein said forming the rear side electrode comprises forming a rear side electrode made of laminated Cr and Au metals.

17. The method of claim 13, wherein said connecting the rear side of the divided semiconductor substrate to the assembly substrate comprises connecting the rear side with Ag paste or AuSn paste.

18. The method of claim 12, wherein said applying the photosensitive resin to the semiconductor substrate comprises applying a photosensitive resin having a main ingredient of silicone resin or epoxy resin.

19. The method of claim 12, wherein said applying the photosensitive resin to the semiconductor substrate comprises applying a photosensitive resin having viscosity at 25° C. in a range of 70 mPa·s to 600 mPa·s.

20. The method of claim 12, wherein said forming the rear side electrode comprises forming a rear side electrode made of laminated Cr and Au metals.

\* \* \* \* \*